United States Patent [19]
Wu

[11] Patent Number: 6,127,247
[45] Date of Patent: Oct. 3, 2000

[54] METHOD OF ELIMINATING PHOTORESIST OUTGASSING IN CONSTRUCTING CMOS VERTICALLY MODULATED WELLS BY HIGH ENERGY ION IMPLANTATION

[75] Inventor: Shye-Lin Wu, Hsinchu, Taiwan

[73] Assignee: Texas Instruments - Acer Incorporated, Hsinchu, Taiwan

[21] Appl. No.: 09/089,899

[22] Filed: Jun. 3, 1998

[51] Int. Cl.[7] ................................................. H01L 21/425
[52] U.S. Cl. .................... 438/514; 438/514; 438/225; 438/297; 438/452; 438/527
[58] Field of Search .................................. 438/514, 452, 438/225, 297, 199, 527

[56] References Cited

U.S. PATENT DOCUMENTS

| | | |
|---|---|---|
| 5,561,076 | 10/1996 | Yoshino . |
| 5,821,589 | 10/1998 | Borland .................................. 257/369 |
| 5,963,799 | 10/1999 | Wu ........................................... 438/199 |
| 5,966,618 | 10/1999 | Sun et al. .................................. 438/452 |

OTHER PUBLICATIONS

Rubin et al., Process Architectures using MeV Implanted Blanket Buried Layers for Latch–Up Improvements on Bulk Silicon, 1997 IEEE, pp. 13–16.

Borland, Current & Emerging Production Applications/Trends of MeV Technology, 1997 IEEE, pp. 17–20.

Borland et al., Epi Avoidance for CMOS Logic Devices Using MeV Implantation, 1997 IEEE, pp. 21–24.

Lee et al., Thick PhotoResist Outgassing During MeV Implantation (Mechanism & Impact on Production), 1997 IEEE, pp. 186–189.

*Primary Examiner*—David Nelms
*Assistant Examiner*—Phuc T. Dang
*Attorney, Agent, or Firm*—Harness, Dickey & Pierce, P.L.C.

[57] ABSTRACT

The present invention proposes a method for forming vertically modulated wells in a semiconductor substrate. The method can include the steps as follows. At first, isolation regions are formed over the substrate. A pad layer is then formed over the substrate and a photoresist layer is formed over the pad layer. Then, p-well regions are defined by removing portions of the photoresist layer. Next, first p-wells are formed in the substrate under the p-well regions. After forming a masking layer over the p-well regions, the photoresist layer is removed. A first thermal process is then performed. Second p-wells are formed in the substrate at a level below the first p-wells. Next, n-wells are formed in the substrate under regions uncovered by the masking layer and above the second p-wells. The masking layer and the pad layer are then removed. Finally, a second thermal process is performed to finish the formation of vertically modulated wells.

12 Claims, 4 Drawing Sheets

METHOD OF ELIMINATING PHOTORESIST OUTGASSING IN CONSTRUCTING CMOS VERTICALLY MODULATED WELLS BY HIGH ENERGY ION IMPLANTATION

FIELD OF THE INVENTION

The present invention relates to semiconductor manufacturing processes, and more specifically, to a method of eliminating photoresist outgassing in constructing CMOS (complementary metal oxide semiconductor) vertically modulated wells by high energy ion implantation.

BACKGROUND OF THE INVENTION

From the first invention of integrated circuits in 1960, the number of devices on a chip has grown at an explosively increasing rate. Technologies of the semiconductor industry have been researched continuously for almost four decades. The progress of the semiconductor integrated circuits has stepped into the ULSI (ultra large scale integration) level or even a higher level. The capacity of a single semiconductor chip has increased from several thousand devices to hundreds of million devices, or even to billions of devices. Integrated circuit devices like transistors, capacitors, and connections must be greatly narrowed simultaneously to achieve such a high packing density.

The increasing packing density of the integrated circuits has generated numerous challenges to the semiconductor manufacturing process. Every device needs to be formed within a smaller area without damaging characteristics and functional operations. The demands on high packing density and low heat generation devices with good reliability and long operation life must be maintained without any degradation in their functions.

All of the challenges and demands in fabrication are expected to be solved with the four key aspects of semiconductor manufacturing, including the lithography, the film formation, the etching, and the diffusion processing technologies. The continuous increase in the packing density of the integrated circuits must be accompanied with a smaller feature size. In addition to chip area and functional considerations, all of the devices with smaller sizes must be achieved with simplified and reliable manufacturing steps to raise the yield and reduce the cost of products.

In CMOS manufacturing processes, well formation is a vital issue with the downscaling of transistor size. The undesired lateral diffusion in forming n-wells and p-wells has the effect of reducing packing density. The concept of the retrograde well was proposed for using high energy implants to place the dopants at the desired depth without further lateral diffusion. The peak of the implant can be buried at a certain depth within the substrate by adjusting implanting energy. Thus the lateral diffusion problem can be solved and the packing density of CMOS devices can be raised by forming the retrograde wells.

In addition, the high energy ion implantation is increasingly integrated into leading edge CMOS processes. The high energy ion implantation provides a simpler process in well formation than conventional diffusion processes.

L. M. Rubin et al. disclose that doped buried layers formed by MeV ion implantation are attractive alternatives to expensive epitaxial substrates for controlling latch-up in CMOS devices, in their work "Process Architectures using MeV implanted Blanket Buried Layers for Latch-Up Improvements on Bulk Silicon" (in Proceeding on Ion implantation Technology, p. 13, 1996). Two different process architecture approaches for forming effective buried layers are discussed. With the process simplifications and cost saving characteristics, the high energy ion implantation is widely employed in the leading edge CMOS processes. The largest single production application of high energy implantation is currently the implanting of retrograde wells which can replace conventional diffused wells. For future process designs, some investigators are looking at MeV implanted buried layers as a replacement for the latch-up suppression capability of epitaxial layers. A comparison between B.L./C.L. process and PAB architecture is addressed in the work.

The developing trend in the application of MeV implantation is presented by J. O. Borland in the work "Current & Emerging Production Application/Trends of MeV Technology" (in Proceeding on Ion implantation Technology, p. 17, 1996). The motivation from a manufacturing point of view is also presented for MeV twin and triple well formation including process simplification, cost reduction and improved productivity/capacity and profits. The transition from diffused twin and triple well structures to retrograde twin and triple wells eliminate typically two masking layers, high temperature well drive-ins and about 13% in total processing steps. The power of MeV in strategic cost reduction is also illustrated in the work.

J. O. Borland et al. illustrate the prospects of using doped buried layers by MeV implantation as alternatives to expensive epitaxial substrate in the work "Epi Avoidance for CMOS Logic Devices Using MeV Implantation" (in Proceeding on Ion implantation Technology, p. 21, 1996). Using MeV ion implantation and Cz bulk wafer denuding/gettering techniques, they have successfully demonstrated in bulk (non-epi) wafers superior latch-up performance and equivalent surface silicon quality (gate oxide integrity and junction leakage current) to that of p/p+ epi wafers resulting in direct retrofit replacement of epi wafers in manufacturing. The paper summarizes the various MeV epi replacement alternatives describing the advantages and limitations of each form a production implementation point of view.

However, with the outstanding characteristics and practical values in employing the MeV technology, the thick photoresist outgassing during MeV ion implantation is a major production issue.

W. J. Lee et al. illustrated the issue in the paper "Thick PhotoResist Outgassing During MeV Implantation (Mechanism & Impact on Production)" (in Proceeding on Ion implantation Technology, p. 186, 1996). It is disclosed that the generation of an ion beam and its impact into photoresist-masked wafers will have an adverse effect on the vacuum of an MeV ion implanter. They present the mechanism and effects of photoresist outgassing caused by high energy ion implantation (250 KeV to 3 MeV). Due to photoresist outgassing and its effects, production usable beam current on small process chamber can be significantly limited. Photoresist outgassing form various implant conditions are discussed. It is addressed that outgassing in the process chamber must be examined to minimize errors in dosimetry resulting from pressure increases.

Therefore, for exploiting the benefit of the high energy implantation process without the doping concentration shift issue caused by photoresist outgassing, a method of eliminating pressure variation during implantation process is highly needed. A method of eliminating photoresist outgassing in constructing CMOS vertically modulated wells by high energy ion implantation is in demand.

SUMMARY OF THE INVENTION

A method of eliminating photoresist outgassing in constructing CMOS vertically modulated wells by high energy ion implantation is disclosed in the present invention. A masking layer is used during the implantation and the outgassing issue in the conventional process can be avoided.

The present invention proposes a method for forming vertically modulated wells in a semiconductor substrate. The method can include the steps as follows. At first, isolation regions are formed over the substrate. A pad layer is then formed over the substrate and a photoresist layer is formed over the pad layer. Then, p-well regions are defined by removing portions of the photoresist layer. Next, first p-wells are formed in the substrate under the p-well regions. After forming a masking layer over the p-well regions, the photoresist layer is removed. A first thermal process is then performed. Second p-wells are formed in the substrate at a level below the first p-wells. Next, n-wells are formed in the substrate under regions uncovered by the masking layer and above the second p-wells. The masking layer and the pad layer are then removed. Finally, a second thermal process is performed to finish the formation of vertically modulated wells.

As a preferred embodiment, the masking layer can be an oxide layer which is formed selectively with a liquid phase deposition (LPD) process. The LPD oxide forms selectively on the regions without the presence of the photoresist layer. Thus the process can be simplified and the cost of complex patterning process can be greatly reduced.

BRIEF DESCRIPTION OF THE DRAWINGS

The foregoing aspects and many of the attendant advantages of this invention will become more readily appreciated and better understood by referencing the following detailed description, when taken in conjunction with the accompanying drawings, wherein.

DETAILED DESCRIPTION OF THE PREFERRED EMBODIMENT

The present invention discloses a method of eliminating photoresist outgassing in constructing CMOS vertically modulated wells by high energy ion implantation. With the formation of a masking layer, the prior art problem of dose shifting is solved. The high energy implantation process can be performed without photoresist outgassing and pressure variation.

Figure 1:
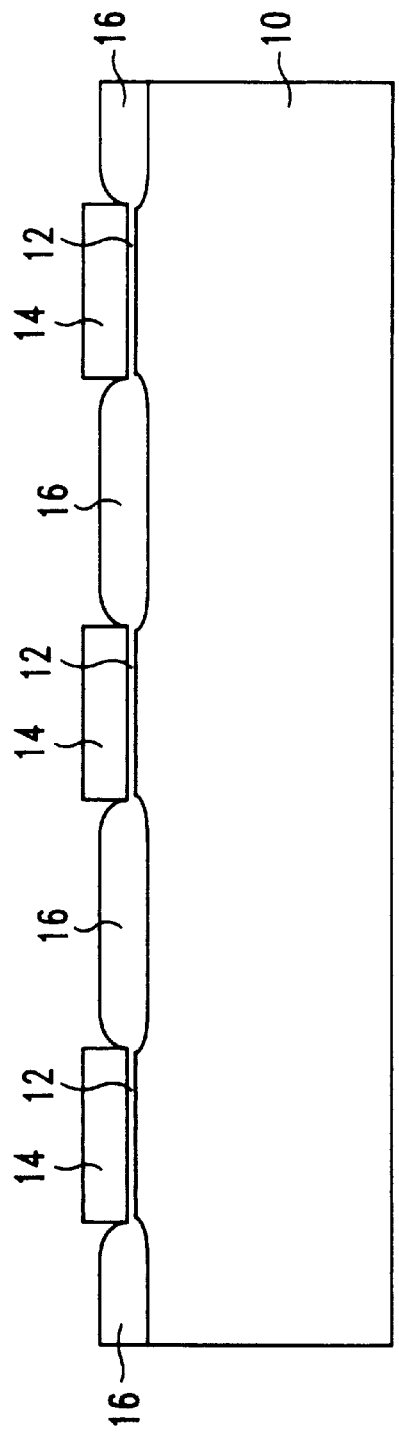
FIG. 1 illustrates a cross-sectional view of forming isolation regions over the substrate in accordance with the present invention.

Referring to FIG. 1, a semiconductor substrate 10 is provided. At first, isolation regions 16 are formed on the substrate 10. As a preferred embodiment, field oxide regions can be formed with a well-known LOCOS (local oxidization of silicon) technology. In LOCOS technology, a pad layer 12 is formed onto the substrate 10. The pad layer 12 can be an oxide layer which is thermally grown from the substrate 10 to serve mainly as a stress-buffering layer for a later formed layer. A oxidization masking layer 14 is then formed and defined on the pad layer 12. A nitride layer can be used as the oxidization masking layer 14 to expose regions of forming field oxide regions. Finally, a thermal oxidization process is performed to grow the field oxide regions 16 thermally.

Figure 2:
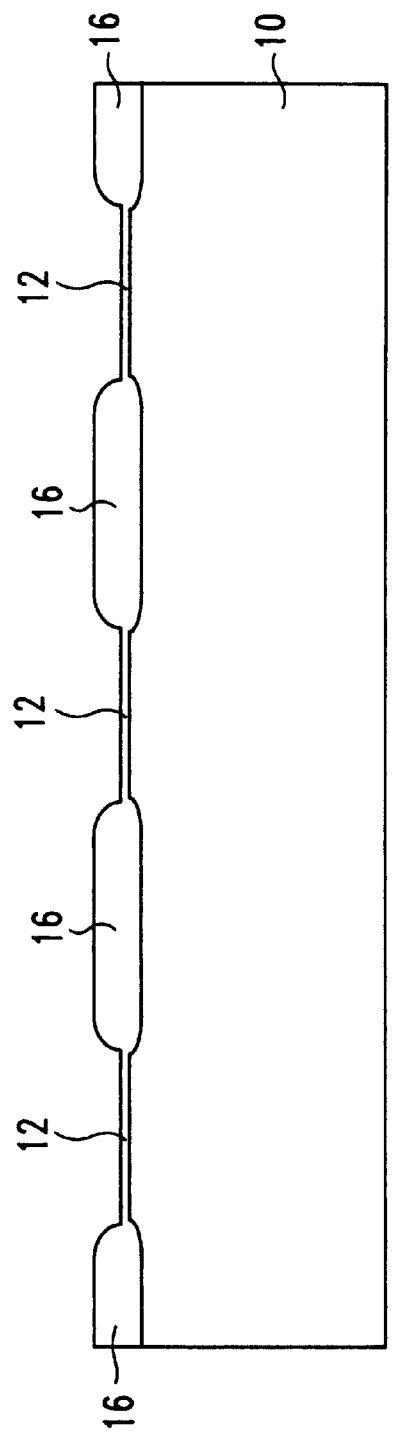
FIG. 2 illustrates a cross-sectional view of removing the oxidization masking layer in accordance with the present invention.
Figure 3:
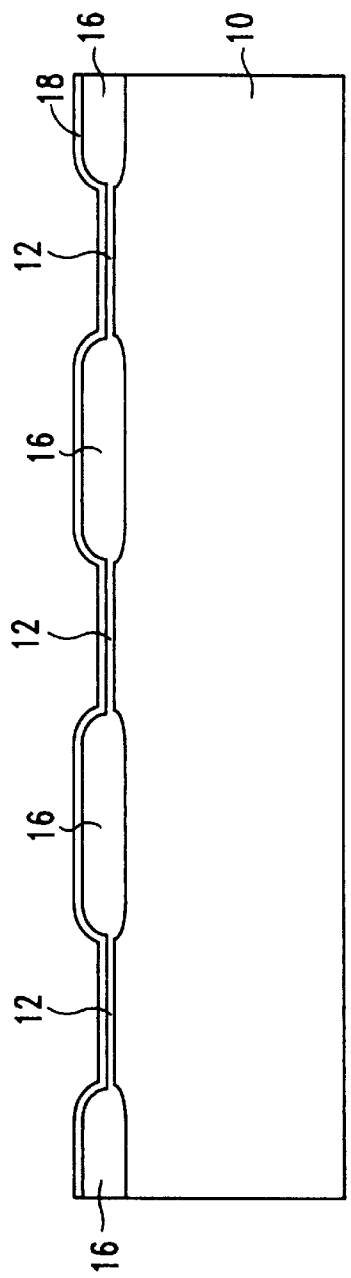
FIG. 3 illustrates a cross-sectional view of forming a pad layer over the substrate in accordance with the present invention.

Turning to FIG. 2, the oxidization masking layer 14 can be removed after the formation of the FOX (field oxide) regions 16. In general, a hot phosphorus acid ($H_3PO_4$) solution can be used to remove the nitride layer 14 in a wet dip process. Referring to FIG. 3, a pad layer 18 is then formed over the substrate 10. The pad layer 18 can be a nitride layer with a thickness between 100 angstroms and 1,000 angstroms. The thin nitride layer can be utilized as a protection layer for underlying materials in later processes. The nitride layer can be formed by a chemical vapor deposition (CVD) process in the case.

Figure 4:
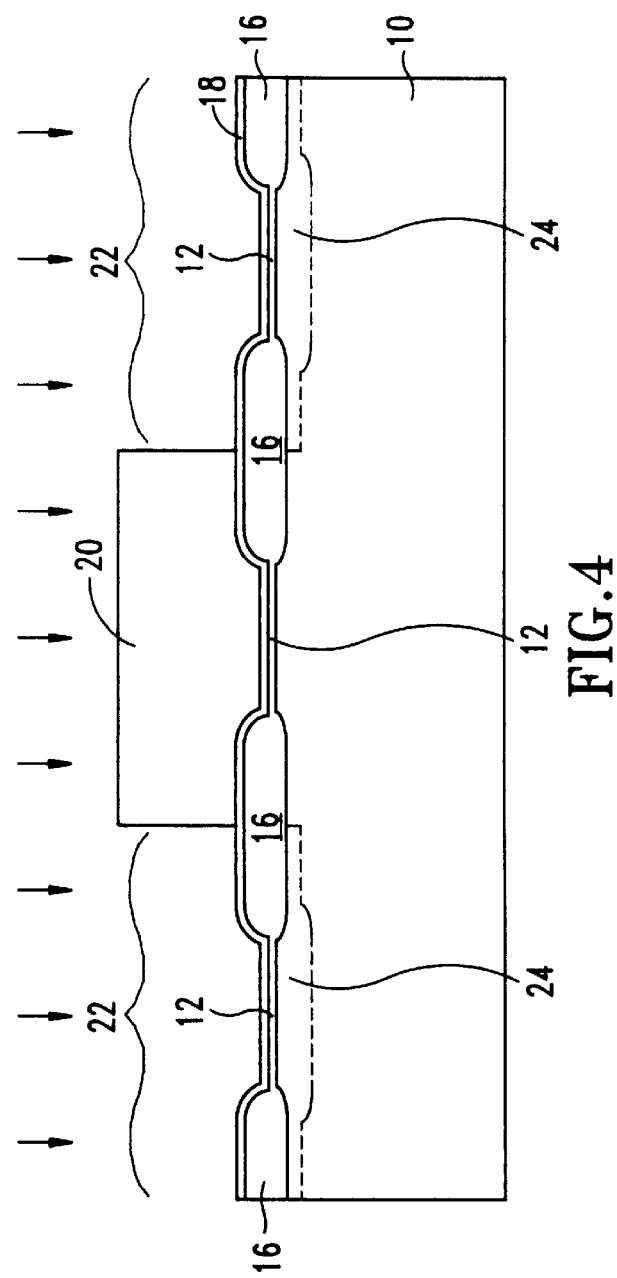
FIG. 4 illustrates a cross-sectional view of forming a photoresist layer over the pad layer and forming first p-wells in the substrate in accordance with the present invention.

Following the formation of the pad layer 18, a photoresist layer 20 is formed thereover, as shown in FIG. 4. Portions of the photoresist layer 20 are then removed to define p-well regions 22, as indicated in the figure. The p-well regions 22 are regions for doping ions to form the p-wells for the CMOS devices. The portions of the photoresist layer 20 are removed to expose the regions. Next, first p-wells 24 are formed in the substrate 10 under the p-well regions 22. In the case, the first p-wells 24 which are served as shallow p-wells can be formed with a first ion implantation process. For forming p-doped regions, ions like boron-containing ions can be implanted in the preferred embodiments. As an example, the first ion implantation is performed with an energy of about 100 keV to about 1000 keV to have a dose of about 1E12 atoms/cm$^2$ to about 1E13 atoms/cm$^2$.

Figure 5:
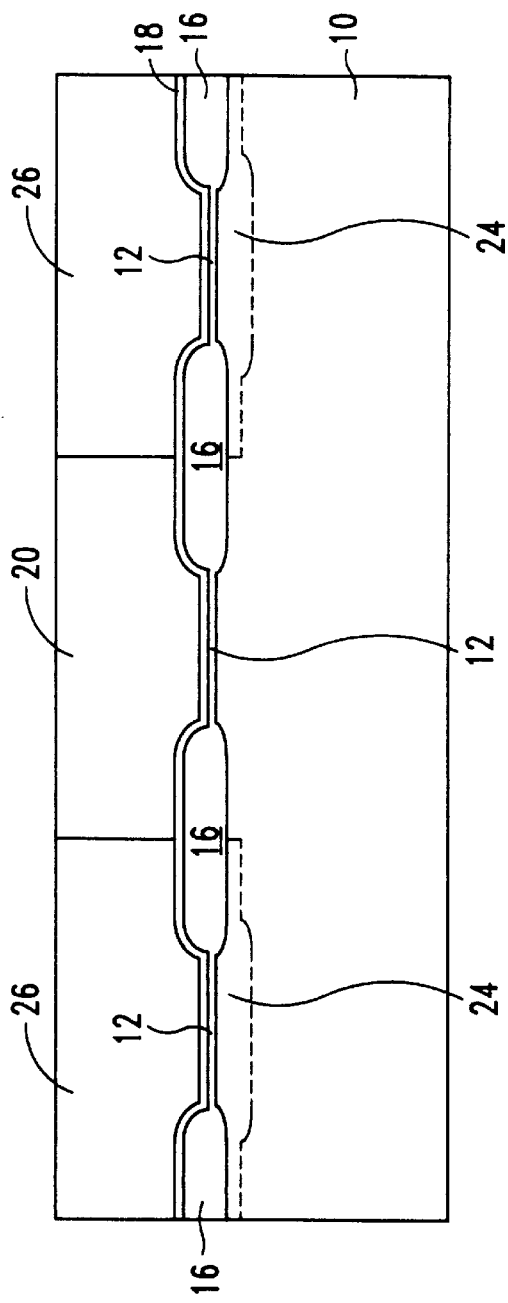
FIG. 5 illustrates a cross-sectional view of forming a masking layer over the p-well regions in accordance with the present invention.

Referring to FIG. 5, a masking layer 26 is then formed over the p-well regions 24, namely on the regions uncovered by the photoresist layer 20. In this case, the masking layer is an oxide layer. For selectively forming the oxide layer on the regions uncovered by the photoresist layer 20 without additional lithography and etching process, a LPD (liquid phase deposition) process can be used preferably. Thus the process of forming the masking layer 26 layer can be significantly simplified by forming oxide layer selectively with minimized process efforts.

In the U.S. Pat. No. 5,561,076 to A. Yoshino titled "Method of Fabricating an Isolation Region for a Semiconductor Device Using Liquid Phase Deposition", the LPD process for forming oxide layer is illustrated. In the proposed method, a low temperature deposition silicon dioxide film is selectively formed in a region in which the semiconductor device is not to be fabricated in the presence of photoresist.

Figure 6:
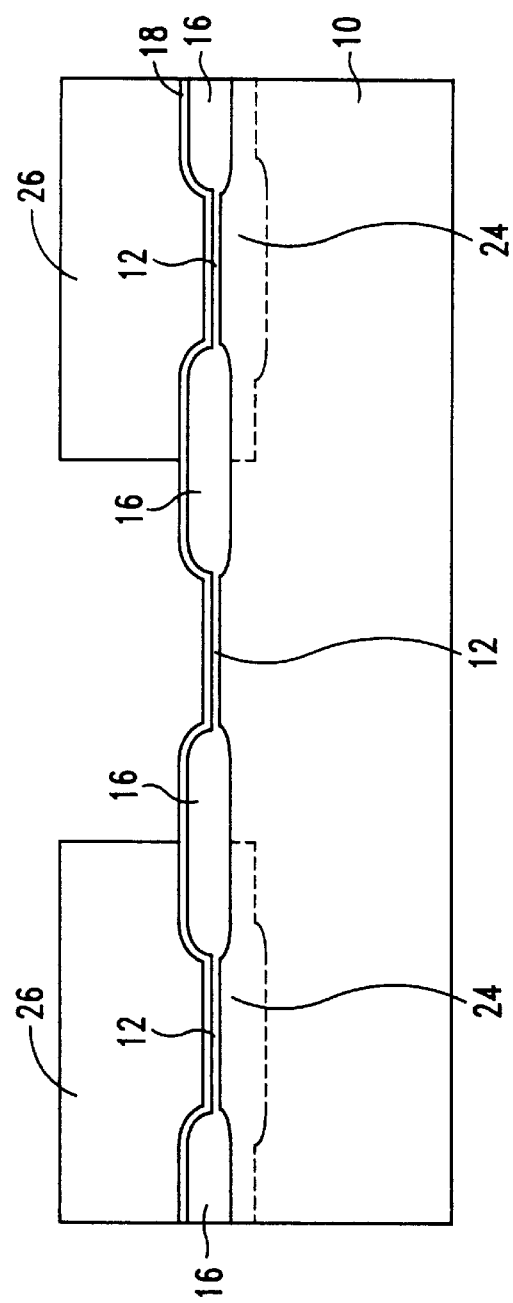
FIG. 6 illustrates a cross-sectional view of removing the photoresist layer in accordance with the present invention.

The photoresist layer 20 is then removed after the masking layer 26 is selectively formed, as shown in FIG. 6. A first thermal process is then performed to density the LPD oxide layer 26. In the case, a high temperature oxygen anneal process can be employed. The ions in the first p-wells are also driven into the substrate 10 in the thermal process.

Figure 7:
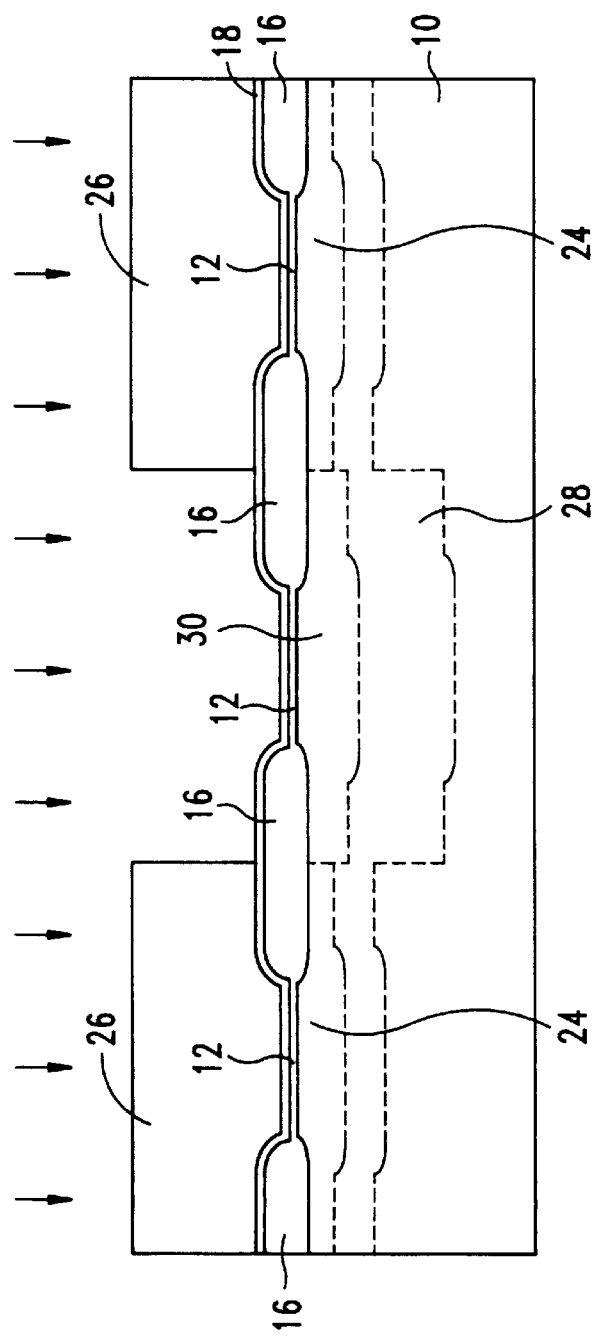
FIG. 7 illustrates a cross-sectional view of forming second p-wells and n-wells in the substrate in accordance with the present invention.

Referring to FIG. 7, second p-wells 28 are then formed in the substrate 10 at a level below the first p-wells 24. The second p-wells can be formed with a second ion implantation process. In this case, boron-containing ions are implanted to form the p-doped regions which serve as deep p-wells 28. The boron-containing ions are implanted through the masking layer 26, down to the regions 28 below the first p-wells 24 in the substrate 10. Therefore, vertically modulated p-wells can be formed with the combination of the shallow p-wells 24 and the deep p-wells 28. Under the region uncovered by the masking layer 26, the boron-containing ions are implanted deeper under the region for forming n-wells, as shown in the figure. For achieving deep implantation, a high energy implantation process can be employed with an energy between about 500 keV to about 5 MeV with a dose of about 5E11 atoms/cm$^2$ to about 1E15 atoms/cm$^2$.

Next, n-wells 30 are formed in the substrate 10 under regions uncovered by the masking layer 26. The n-wells are formed substantially under the substrate surface and above the second p-wells 28. In the same way, the n-wells 30 can be formed with a third ion implantation process and phosphorus-containing ions can be implanted for n-doped regions. The third ion implantation is performed with an energy of about 200 keV to about 3 MeV to have a dose of about 1E12 atoms/cm$^2$ to about 5E13 atoms/cm$^2$. With the shielding of the masking layer 26 over the p-wells, the implanted ions are unable to penetrate down to the substrate 10 and n-wells 30 are formed only under the openings between the masked regions.

Figure 8:
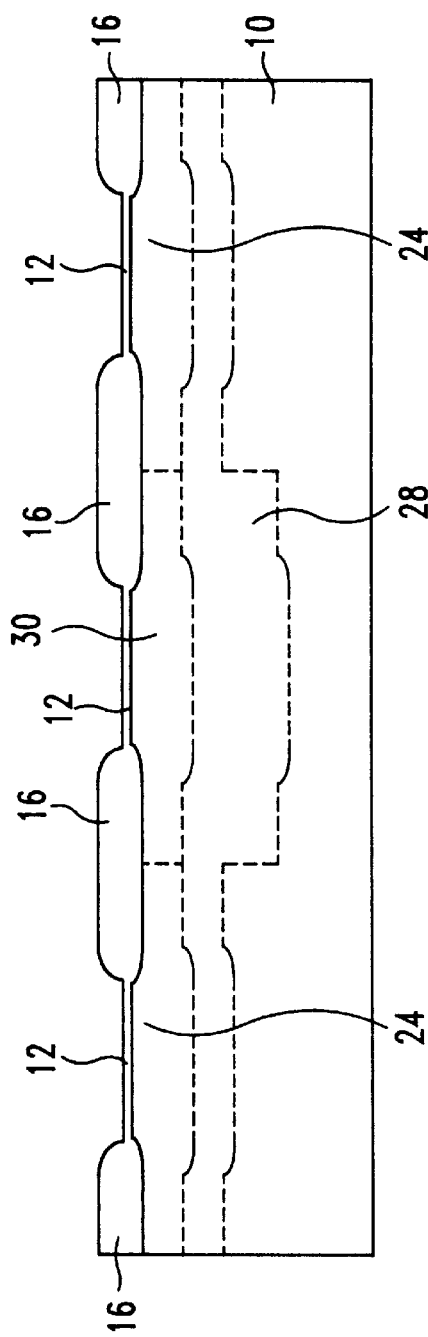
FIG. 8 illustrates a cross-sectional view of removing the masking layer and the pad layer in accordance with the present invention.

Referring to FIG. 8, the masking layer 26 is then removed. The masking layer 26, namely the LPD oxide layer in the case, can be removed with a hydrofluoric acid (HF) containing solvent, like BOE solution. During the etching of the LPD oxide layer 26, the pad layer 18 acts as an etching-stop layer. Therefore, the underlying layers like pad oxide, field oxide, and silicon substrate regions can be protected from undesired damages. The pad layer 18 is then removed. With the nitride pad layer 18 in this case, a hot phosphorus ($H_3PO_4$) acid can be used.

Finally, a second thermal process is performed to recover the implant-induced damages. A well-known anneal process is used in this case.

Therefore, vertically modulated wells for constructing CMOS devices are formed with the method described above. The masking layer 26 is used for eliminating photoresist outgassing in prior art well formation processes with high energy implantation. Thus the vertically modulated and better-structured wells are provided for forming high performance CMOS devices with raised packing density. The latch-up problem of conventional wells formed by a diffusion scheme can be avoided and the substrate with the well formation technology can be used to replace the conventional expensive epitaxial substrates.

As is understood by a person skilled in the art, the foregoing descriptions of the preferred embodiment of the present invention are illustrative of the present invention rather than being a limitation thereon. They are intended to cover various modifications and similar arrangements included within the spirit and scope of the appended claims. The scope of the claims should be accorded the broadest interpretation so as to encompass all such modifications and similar structures. While the preferred embodiment of the invention has been illustrated and described, it will be appreciated that various changes can be made therein without departing from the spirit and scope of the invention.

What is claimed is:

1. A method of forming vertically modulated wells in a semiconductor substrate, said method comprising the steps of:

forming isolation regions over said substrate;

forming a pad layer over said substrate;

forming a photoresist layer over said pad layer;

defining p-well regions by removing portions of said photoresist layer;

forming first p-wells in said substrate under said p-well regions by a first ion implantation, said first ion implantation is performed with an energy between about 100 keV to about 1000 keV and a dose of about 1E12 atoms/cm$^2$ to about 1E13 atoms/cm$^2$;

forming a masking layer over said p-well regions;

removing said photoresist layer;

performing a first thermal process;

forming a second p-wells in said substrate at a level below said first p-wells by a second ion implantation, said second ion implantation is performed with an energy between about 500 keV to about 5 MeV and a dose of about 5E11 atoms/cm$^2$ to about 1E15 atoms/cm$^2$;

forming n-wells in said substrate under regions uncovered by said masking layer and above said second p-wells by a third ion implantation, said third ion implantation is performed with an energy between about 200 keV to about 3 MeV and a dose of about 1E12 atoms/cm$^2$ to about 5E13 atoms/cm$^2$;

removing said masking layer and said pad layer; and performing a second thermal process.

2. The method of claim 1, wherein said isolation regions comprise field oxide regions which are thermally grown from said substrate.

3. The method of claim 1, wherein said pad layer comprises a nitride layer.

4. The method of claim 1, wherein said first ion implantation uses boron-containing ions.

5. The method of claim 1, wherein said masking layer comprises an oxide layer.

6. The method of claim 1, wherein said second ion implantation uses boron-containing ions.

7. The method of claim 1, wherein said third ion implantation uses phosphorus-containing ions.

8. A method of forming vertically modulated wells in a semiconductor substrate, said method comprising the steps of:

forming isolation regions over said substrate;

forming a pad layer over said substrate;

forming a photoresist layer over said pad layer, said pad layer comprises a nitride layer;

defining p-well regions by removing portions of said photoresist layer;

forming first p-wells in said substrate under said p-well regions by a first ion implantation, said first ion implantation is performed with an energy between about 100 keV to about 1000 keV and a dose of about 1E12 atoms/cm$^2$ to about 1E13 atoms/cm$^2$;

forming a masking layer over said p-well regions, said masking layer comprises an LPD (liquid phase deposited) oxide layer;

removing said photoresist layer;

performing a first thermal process;

forming a second p-wells in said substrate at a level below said first p-wells by a second ion implantation, said second ion implantation is performed with an energy between about 500 keV to about 5 MeV and a dose of about 5E11 atoms/cm² to about 1E15 atoms/cm²;

forming n-wells in said substrate under regions uncovered by said masking layer and above said second p-wells by a third ion implantation, said third ion implantation is performed with an energy between about 200 keV to about 3 MeV and a dose of about 1E12 atoms/cm² to about 5E13 atoms/cm²;

removing said masking layer and said pad layer; and performing a second thermal process.

9. The method of claim 8, wherein said isolation regions comprise field oxide regions which are thermally grown from said substrate.

10. The method of claim 8, wherein said first ion implantation uses boron-containing ions.

11. The method of claim 8, wherein said second ion implantation uses boron-containing ions through said masking layer.

12. The method of claim 8, wherein said third ion implantation uses phosphorus-containing ions.

* * * * *